US011867772B2

(12) United States Patent
Pedrosa Santos (10) Patent No.: US 11,867,772 B2
(45) Date of Patent: Jan. 9, 2024

(54) SYSTEM, METHOD AND DEVICE FOR MONITORING THE SEALING OF ELECTRICAL EQUIPMENT AND ELECTRICAL EQUIPMENT WITH MONITORED SEALING

(71) Applicant: Treetech Sistemas Digitais Ltda, Atibaia (BR)

(72) Inventor: Heber Pedrosa Santos, Atibaia (BR)

(73) Assignee: Treetech Sistemas Digitais Ltda, Atibaia (BR)

( * ) Notice: Subject to any disclaimer, the term of this patent is extended or adjusted under 35 U.S.C. 154(b) by 167 days.

(21) Appl. No.: 17/608,125

(22) PCT Filed: Apr. 22, 2020

(86) PCT No.: PCT/BR2020/050136
§ 371 (c)(1),
(2) Date: Nov. 1, 2021

(87) PCT Pub. No.: WO2020/223776
PCT Pub. Date: Nov. 12, 2020

(65) Prior Publication Data
US 2023/0034254 A1    Feb. 2, 2023

(30) Foreign Application Priority Data

May 3, 2019   (BR) .......................... 102019009071-5

(51) Int. Cl.
*G01R 31/62* (2020.01)
*G08B 21/20* (2006.01)

(52) U.S. Cl.
CPC ............. *G01R 31/62* (2020.01); *G08B 21/20* (2013.01)

(58) Field of Classification Search
CPC .......... G01R 31/62; G08B 21/20; H01F 27/14
(Continued)

(56) References Cited

U.S. PATENT DOCUMENTS 5,736,915 A * 4/1998 Goedde .................. H01F 27/12
336/60

FOREIGN PATENT DOCUMENTS

CA       2 241 035 A       1/2005
CN       105810393 A       7/2016
(Continued)

OTHER PUBLICATIONS

International Search Report (with English translation) dated Jul. 22, 2020 for International Application No. PCT/BR2020/050136.
(Continued)

*Primary Examiner* — Farhana A Hoque
(74) *Attorney, Agent, or Firm* — Lippes Mathias LLP (57) ABSTRACT

A monitoring system, method, and device for sealing electrical equipment (10) and electrical equipment (10) with monitored sealing, including at least one sensor set (100), at least one signaling system (15) and at least one drying system (300), wherein the sensor set (100) includes at least one moisture sensor (20) and at least one liquid presence sensor (25) connected to at least one centralizing element (30), wherein the centralizing element (30) is configured to receive data from at least the sensors and generate outputs corresponding thereto, defining the type of liquid in contact with a sensor, assessing the integrity of the sealing system, and detecting the loss of efficiency of the drying system (300). The system may be configured to detect trends and automatically generate alarms and recommendations, mitigating the from inspections of sealing systems on electrical equipment (10) while enhancing the reliability of the operation, lowering costs and enhancing safety and security.

34 Claims, 9 Drawing Sheets

(58) Field of Classification Search
USPC .......................................................... 324/547
See application file for complete search history.

(56) References Cited

FOREIGN PATENT DOCUMENTS

| | | |
|---|---|---|
| CN | 105810395 A | 7/2016 |
| CN | 106128710 A | 11/2016 |
| CN | 107424816 A | 12/2017 |
| CN | 106531404 B | 9/2018 |
| CN | 109346272 A | 2/2019 |
| KR | 10-2012-0053120 | 5/2012 |
| KR | 10-1285140 | 7/2013 |

OTHER PUBLICATIONS

Written Opinion dated Jul. 22, 2020 for International Application No. PCT/BR2020/050136.
International Preliminary Report on Patentability (with English translation) dated Aug. 4, 2021 for International Application No. PCT/BR2020/050136.

* cited by examiner

SYSTEM, METHOD AND DEVICE FOR MONITORING THE SEALING OF ELECTRICAL EQUIPMENT AND ELECTRICAL EQUIPMENT WITH MONITORED SEALING

The present invention refers to a monitoring system, method, and device for monitoring electrical equipment sealing and electrical equipment with monitored sealing, comprising at least one sensor set, at least one signaling means, and at least one drying means, wherein the sensor set comprises at least one moisture sensor, at least one liquid presence sensor and at least one centralizing element, through which parameters are monitored, related principally to the sealing of its components and/or compartments.

DESCRIPTION OF THE STATE OF THE ART

In many transformers, the windings are immersed in fluids, such as insulating oil, developed especially to comply with heat transfer, electrical insulation, chemical stability, and durability requirements that are needed for such purposes, etc.

Moisture is one of the elements that can downgrade fluid quality, endangering the transformer, users and passers-by. This is why there is always concern over keeping the transformer well sealed against it.

One of the most critical points for moisture to enter the transformer is through a failure in the sealing system, for example, in an oil expansion tank, in which there are oil volume variations, as temperatures vary.

In order to mitigate the risk of water infiltrating through the expansion tank, it has a sealing system mainly comprising a rubber bag or membrane that can handle the expansion of the oil while keeping it separate from the atmosphere. Furthermore, an air dryer installed at the entrance to the expansion tank ensures that air coming into contact with the expansion bag is always dry.

Well aware of the social costs and risks of inefficient preventive maintenance, electricity concessionaires inspect and install sensors on the sealing system that may detect a possible failure in the membrane before the transformer suffers a catastrophic failure.

However, the following equipment and procedures are currently used for preventive maintenance of sealing systems:

Installation of an oil presence sensor on the membrane or in the expansion bag, in order to monitor its integrity and detect possible breaks.

Regular inspections for visual assessments of the silica status gel or some other drying system that dehumidifies the air entering the expansion tank.

It is thus noted that the equipment and procedures used for preventive maintenance of the sealing system are largely based on two pillars: one is the installation of an ordinary sensor; and the other is the laborious task of manually checking the conditions of the drying system status.

The first pillar comprises the detection of presence of oil or liquids in general through a variation in the refraction index in the sensor element, which means that this component can identify an oil leak or liquid presence in general when completely immersed in them.

Simply detecting the liquid presence through an ordinary sensor does not, for example, distinguish whether there was water condensation on the bag or if the failure was more serious, such as a sealing break.

It is possible for water to condense on the bag when the silica is saturated, or the tank sealing is damaged. Under such conditions, a cut in the diaphragm allows the dispersal of water in the oil, undermining its physical and chemical characteristics. Identifying water condensation in the tank and then the presence of oil is an important warning, which indicates that a failure is becoming more severe.

The second pillar comprises laborious manual checks of the drying system status conditions, through which the drying system must be subject to regular visual inspections. For silica drying (the method most widely used) it is noted that its coloring indicates its saturation level by moisture from the air running through such silica. When saturated, it must be replaced.

Regular inspections for visual assessments of the silica in the air dryer may not be frequent enough to avoid the silica becoming saturated, followed by the entry of moisture into the expansion tank. Furthermore, visual inspections are costly, with poor reliability and accuracy levels.

Moreover, the method is focused on checking the silica status, ignoring moisture that might be held in the air in the tank, which could be affected by elements other than the dryer, such as a break in the sealing.

Simply detecting the liquid presence through an ordinary sensor does not allow any distinction between whether water has condensed on the bag, or if there was a more serious failure, such as a bag rupture. It is important to distinguish whether the liquid is water or oil.

Water condensation on the bag is possible when the silica is saturated, when the tank sealing is damaged. Under these conditions, a cut in the diaphragm allows water to spread over the oil, with adverse effects on its physical and chemical characteristics. Identifying water condensation in the tank and then the presence of oil, is an important warning that indicates a failure is getting worse.

In this situation, no system, method or device known in the prior art is able to monitor the integrity of the sealing on electrical equipment, nor consider data and information together in such monitoring, such as moisture and fluid, for example.

In this context, in order to remedy and surmount the problems known at the state of the art as mentioned above, the present invention proposes a system, method, and device that comprises a set of components configured to perform accurate monitoring of the sealing for electrical equipment, noteworthy among which are at least one sensor set, at least one signaling means and at least one drying means. The present invention also proposes electrical equipment with monitored sealing.

In an advantageous manner, the system, method, and device and the electrical equipment with monitored sealing proposed by the present invention are configured to jointly consider data and information such as, for example, moisture and fluid, also considering an events log and analysis methods (for example, stochastic, A.I., among others) for the performance of the said monitoring.

In other words, one configuration of this invention comprises the adoption of a moisture sensor connected to the liquid presence sensor allied to an analysis method that takes the events log into consideration, as will be better described below.

Furthermore, the present invention enhances the safety and security of the facility through predicting and generating alarms, with no need for on-site human assessment, through direct measurement of the electrical equipment parameters.

The present invention thus mitigates the need for manual inspection of the sealing system on the machines, while enhancing the reliability of the operation, lowering costs and enhancing the safety and security of the above-mentioned electrical equipment.

PURPOSES OF THE INVENTION

One purpose of this invention is to provide a monitoring system, method, and device for sealing electrical equipment.

Another purpose of this invention is to provide a monitoring system, method, and device for sealing electrical equipment configured to consider data and information related to at least one of the moisture or fluid, also considering the events log for the performance of the said monitoring.

Another purpose of this invention is to provide a monitoring system, method, and device for sealing electrical equipment that detects possible damage to the sealing of the electrical equipment.

Another purpose of this invention is to provide a monitoring system, method, and device for sealing electrical equipment that does not require regular inspections assessing its components.

Another purpose of this invention is to provide a monitoring system, method, and device for sealing electrical equipment that monitors the efficiency of a drying system.

Another purpose of this invention is to provide a monitoring system, method, and device for sealing electrical equipment that detects the presence of different fluids in a specific region of the said electrical equipment.

Another purpose of this invention is to provide a monitoring system, method, and device for sealing electrical equipment that determines a probable failure point in the sealing.

Another purpose of this invention is to provide a monitoring system, method, and device for sealing electrical equipment that indicates failure criticality in the sealing.

Another purpose of this invention is to provide electrical equipment with monitored sealing.

BRIEF DESCRIPTION OF THE INVENTION

The purposes of this invention are attained by means of a monitoring system, method, and device for sealing electrical equipment and the electrical equipment with monitored sealing, comprising at least one sensor set, at least one signaling means and at least one drying means, wherein the sensor set comprises at least one moisture sensor, at least one liquid presence sensor and at least one centralizing element, wherein the centralizing element is configured to receive data from at least the said sensors and generate outputs corresponding thereto.

BRIEF DESCRIPTION OF THE DRAWINGS

The present invention will be described in greater detail below, based on an example of embodiment demonstrated in the drawings. The Figures show.

DETAILED DESCRIPTION OF THE FIGURES

Figure 1:
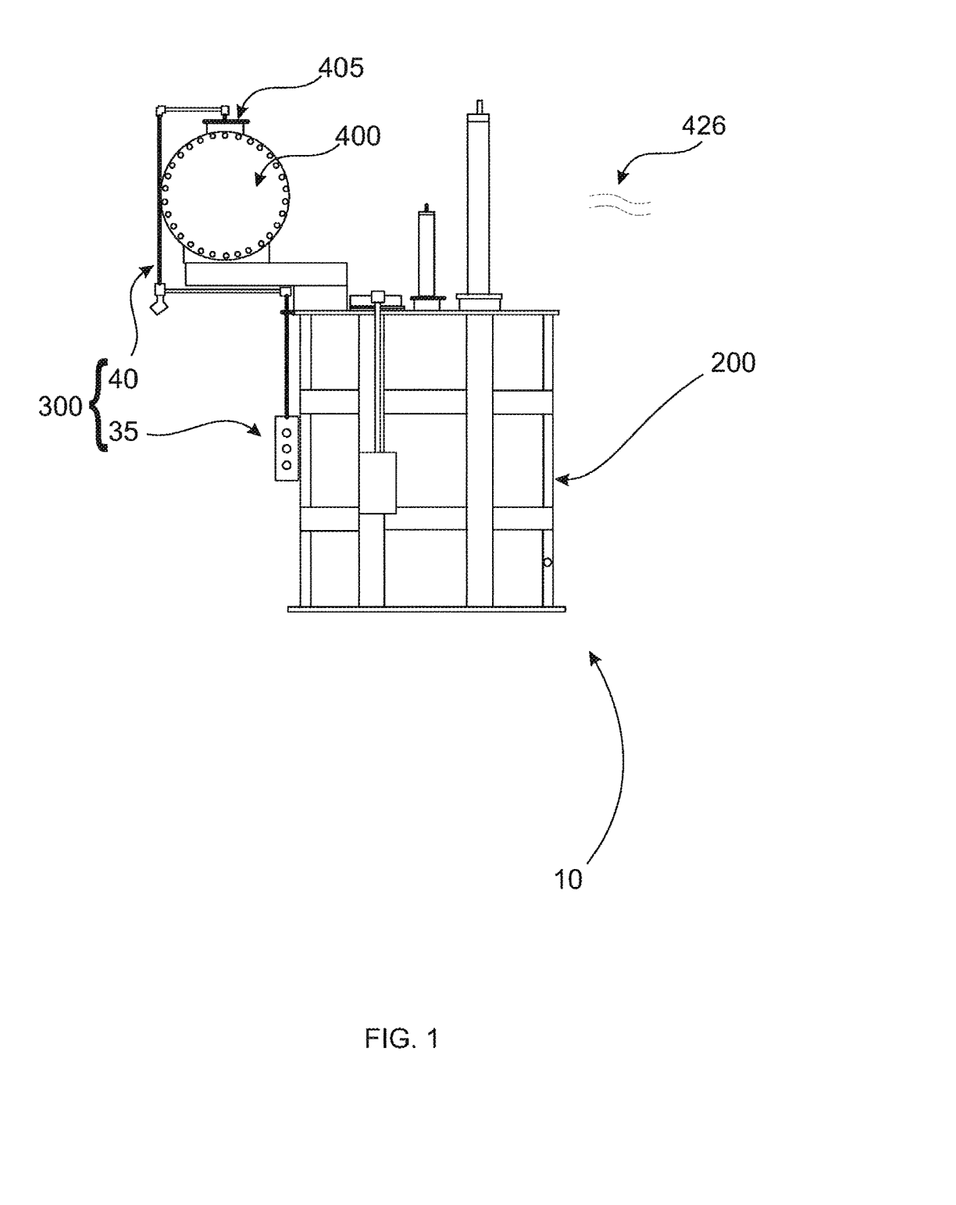
FIG. 1—is an illustration of a part of the electrical equipment (transformer) immersed in oil of the prior art.
Figure 2:
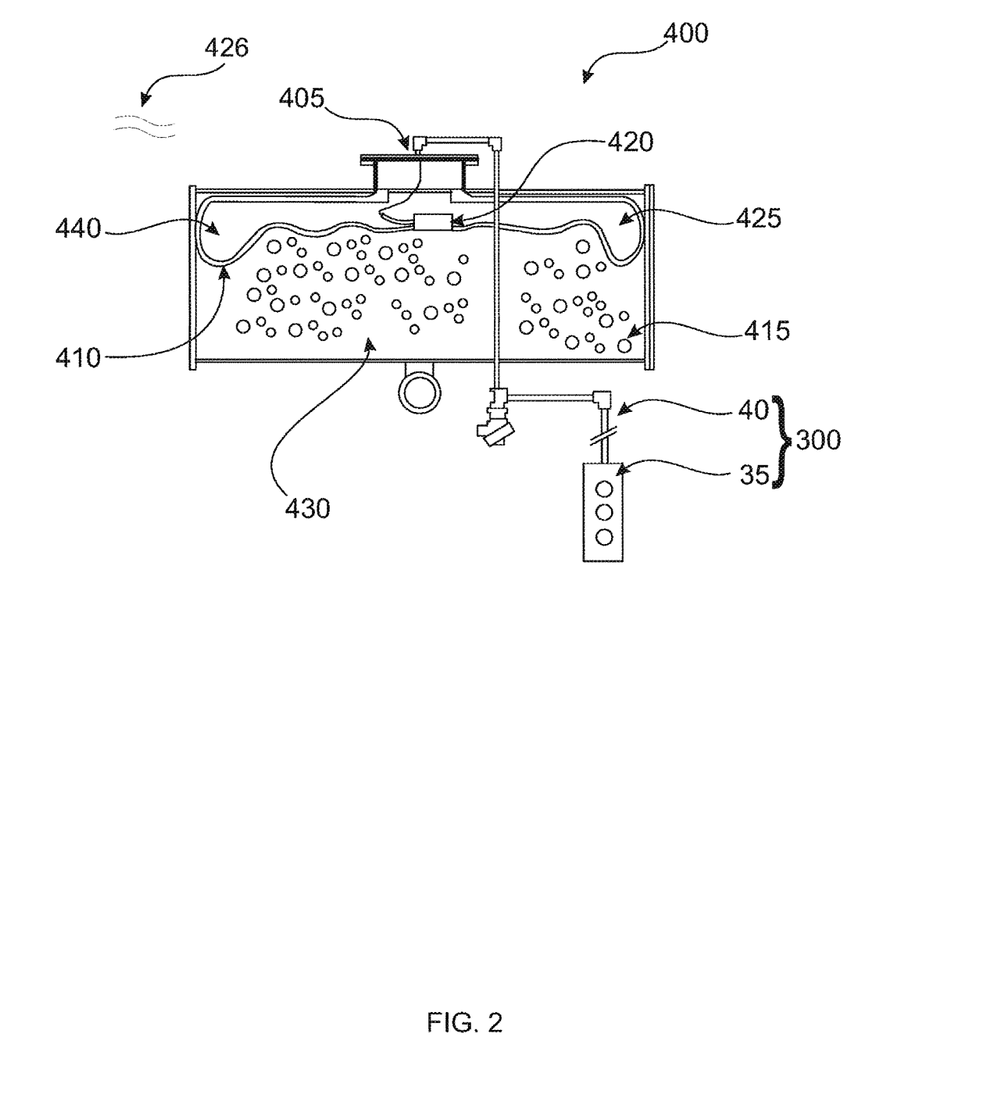
FIG. 2—is an illustration of a cross-section view of an expansion tank at the state of the art, with a sealing system, and complete insulation.

FIGS. 1 and 2 show the components for a part of the electrical equipment 10 at the state of the art, not fitted with the system and method addressed by this invention and with points where failures are more likely to occur, in addition to illustrating the current methodology for monitoring them.

FIG. 1 specifically displays an overview of electrical equipment 10, in this case an oil-insulated transformer that is already known at the state of the art and with the following components:

Main tank 200 of the transformer: please where the windings are immersed in fluid, preferably oil;

Drying system 300: configured like an air dryer and preferably containing silica gel, preferably configured to dehumidify air accessing the expansion tank, being comprised of at least one drying means 35 and piping 40;

Expansion tank 400 of the oil: its interior has a membrane or bag that separates the oil from the air;

Leakproof access point 405 to the interior of the expansion tank 400: configured as a possible installation point for an ordinary oil presence sensor.

FIG. 2 presents a cross-section of the expansion tank 400 at the state of the art, showing the following additional elements:

Rubber bag 410 for containing fluid: configured as a membrane that prevents contact between the fluid and the air;

Fluid 415 in the expansion tank 400 and in contact with the rubber bag 410;

Optical sensor 420: configured to detect leaks of fluid 415 from the bag 410, generating alarms whenever immersed in liquid;

Air 425: kept dry by the air dryer.

In an initial reference to FIGS. 3 to 10 and specific to the proposed invention, it is noted that the present invention refers to a sealing monitoring system 1 for electrical equipment 10, hereinafter simply called the monitoring system 1. More specifically, it refers to a sealing monitoring system 1 for electrical equipment 10 (preferably, but not exclusively, electrical transformers) configured to constantly monitor the integrity of the electrical equipment 10 especially with regard to sealing.

The electrical equipment 10 to which the monitoring system 1 can be fitted is preferably oil-insulated and fitted with at least one expansion tank, also being preferably electrical transformers, as exemplified principally in FIG. 1, although they may alternatively be reactors, for example.

When addressing electrical transformers, they may be of any type, including but not limited to step-down transformers, step-up transformers, current transformers, power transformers, etc. Consequently, the type of transformer may not be understood as a limiting characteristic for the present invention, provided that it is insulated with fluid (for example, oil) and is fitted with an expansion tank.

In general, transformers have at least one expansion tank 400 configured to receive fluids (insulating, preferably oils) into its interior, at least one main tank 200, with the main tank 200 configured to receive windings in its interior, the windings being immersed in a liquid, wherein the transformers also have at least one coil and may present any type of core, air gaps, heat dissipators and may also be single-phase, three-phase or polyphase.

In this context, it must be understood that the integrity of the electrical equipment 10 for which the system is intended and particularly with regard to sealing, is related directly to the presence (occurrence) or not of failures in the said sealing.

The said sealing is preferably performed by means of a sealing system comprised of at least one bag 410 and one drying means 300, as will be described in greater detail below.

The sealing system is configured to allow the expansion of the insulating fluid 415 and prevents the undesirable inflow of air from the outside environment 426 (moisture) into the interior of the transformer per se.

Furthermore, the sealing system is configured for the expansion tank 400 to be divided into a fluid region 430 and a secondary region 440. The fluid region 430 is preferably configured to receive the fluid into its interior and the secondary region 440 is configured to remain dry (fluid-free), as shown particularly in FIG. 3.

Consequently, these failures must preferably be understood as, for example, breaks, cracks, rips, cuts and/or holes that occurred in the said sealing whereby it is unable to perform its main function of sealing (sealing, protecting) the parts or components of the electrical equipment where it was installed.

Figure 4:
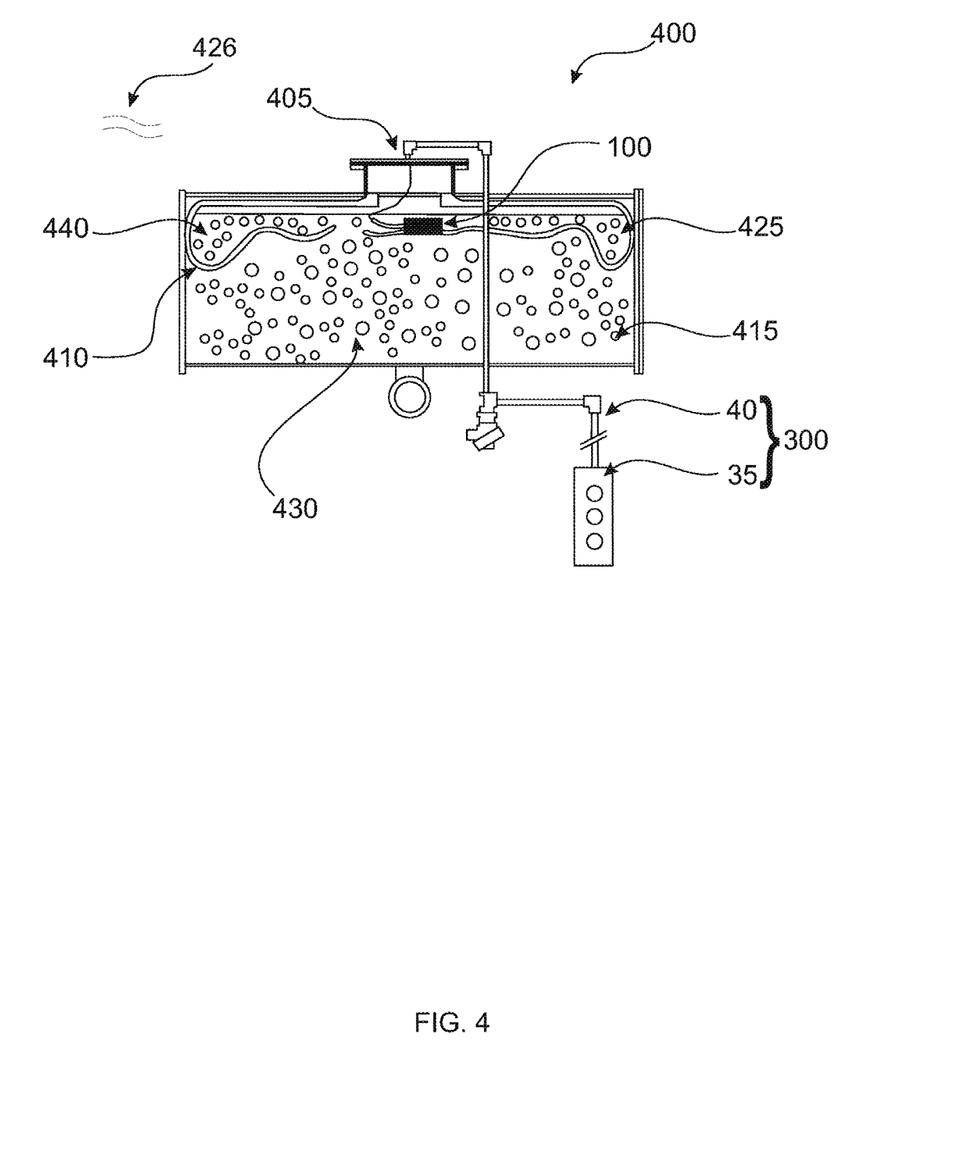
FIG. 4—is an illustration of the expansion tank with a possible failure scenario, where the bag is pierced (failure in the sealing)
Figure 5:
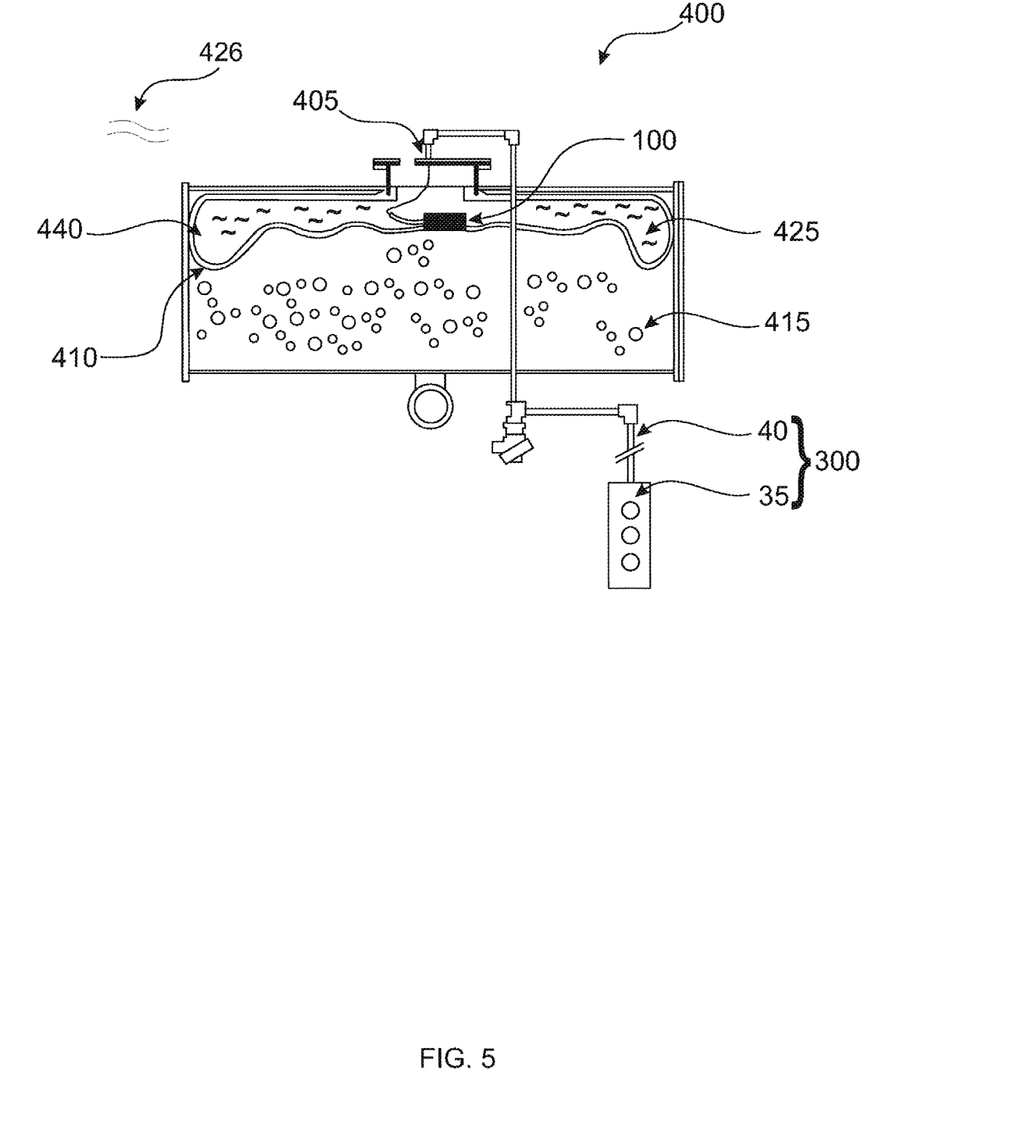
FIG. 5—is an illustration of the expansion tank with a possible failure scenario, with a failure in the sealing.
Figure 6:
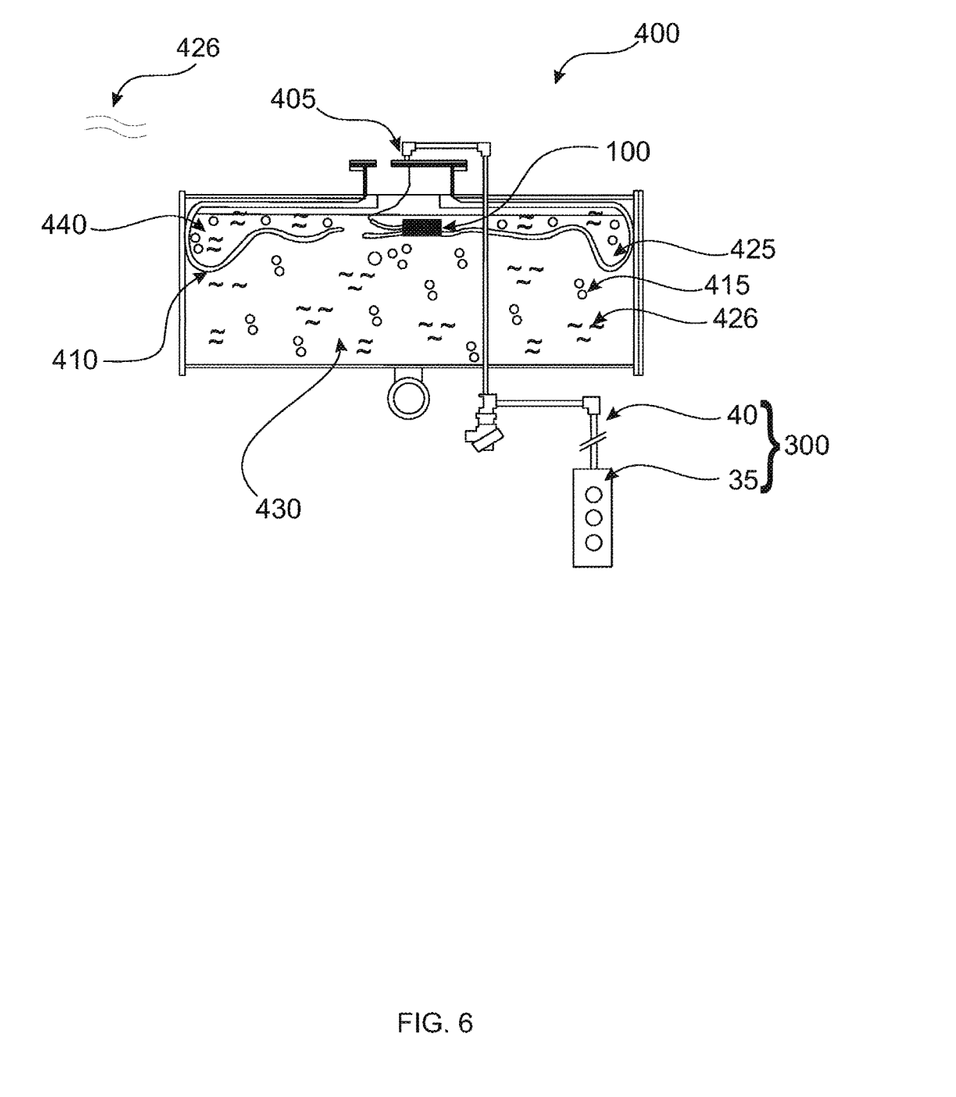
FIG. 6—is a cross-section view of the expansion tank with a possible failure scenario, with a failure in the sealing, and a failure in the sealing.

FIGS. 4, 5 and 6 exemplified as possible failures, showing a failure in the sealing, a failure in the sealing and a failure in the sealing, and in the sealing, respectively.

When the above-mentioned failures occur, it is possible that the secondary region 440 receives fluid into its interior, coming from the fluid region 430, in other words, the fluid may flow from the fluid region 430 two the secondary region 440 through failures in the said sealing.

In other words, in a preferred embodiment, the secondary region 440 is configured to remain fluid-free in the absence of failures in the sealing system and receive fluid into its interior, because of at least one failure in the sealing system.

With regard to the sealing monitoring system 1 for the electrical equipment 10 per se, in a preferred embodiment the said monitoring system comprises at least one sensor set 100, at least one signaling means 15 and at least one drying means 300.

Figure 7A:
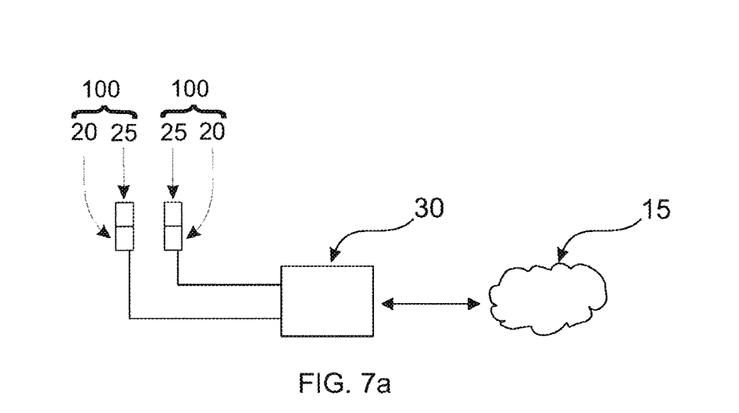
FIGS. 7a, 7b, 7c—are illustrations of possible network options for communications between a centralizing element and the sensors addressed by the present invention.
Figure 7B:
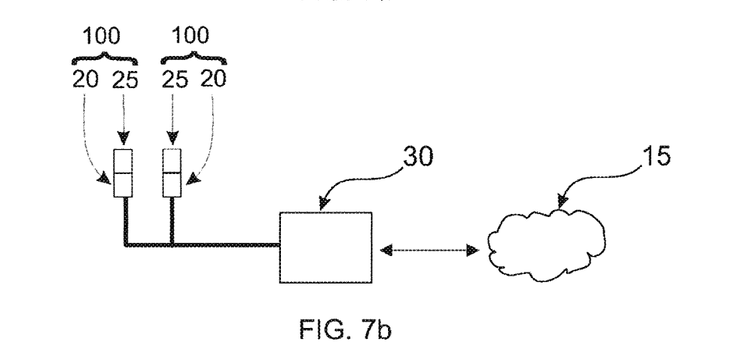
Figure 7C:
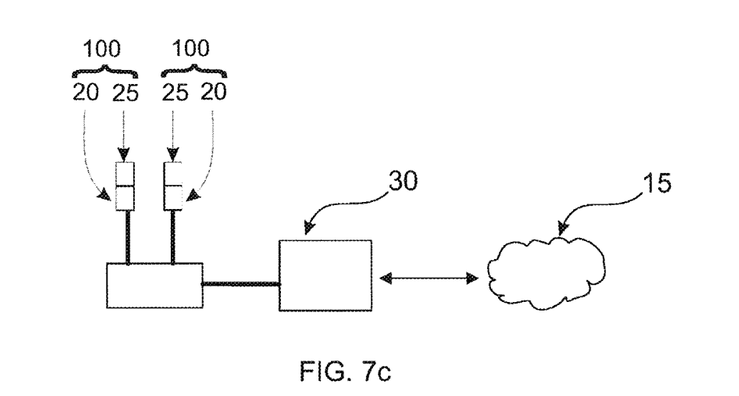

As shown principally in FIGS. 7a, 7b and 7c, the sensor set 100 comprises preferably at least one moisture sensor 20 and at least one liquid presence sensor 25 connected to at least one centralizing element 30, with this connection preferably being electrical.

Consequently FIGS. 7a, 7b and 7c are examples of one configuration of this invention, with several sensors of the sensor set 100 fitted to the centralizing element 30; in other words, each sensor set 100 is comprised of different sensors, whereby the said sensor set 100 may be connected to the respective centralizing element 30 in different ways, as exemplified in the above-mentioned Figures. Obviously, the number of sensors in each sensor set 100 and/or the number of sensor sets 100 must not be understood as limitations on this invention, whereby configurations can be implemented with several sensors and/or several sensor sets 100.

Figure 9:
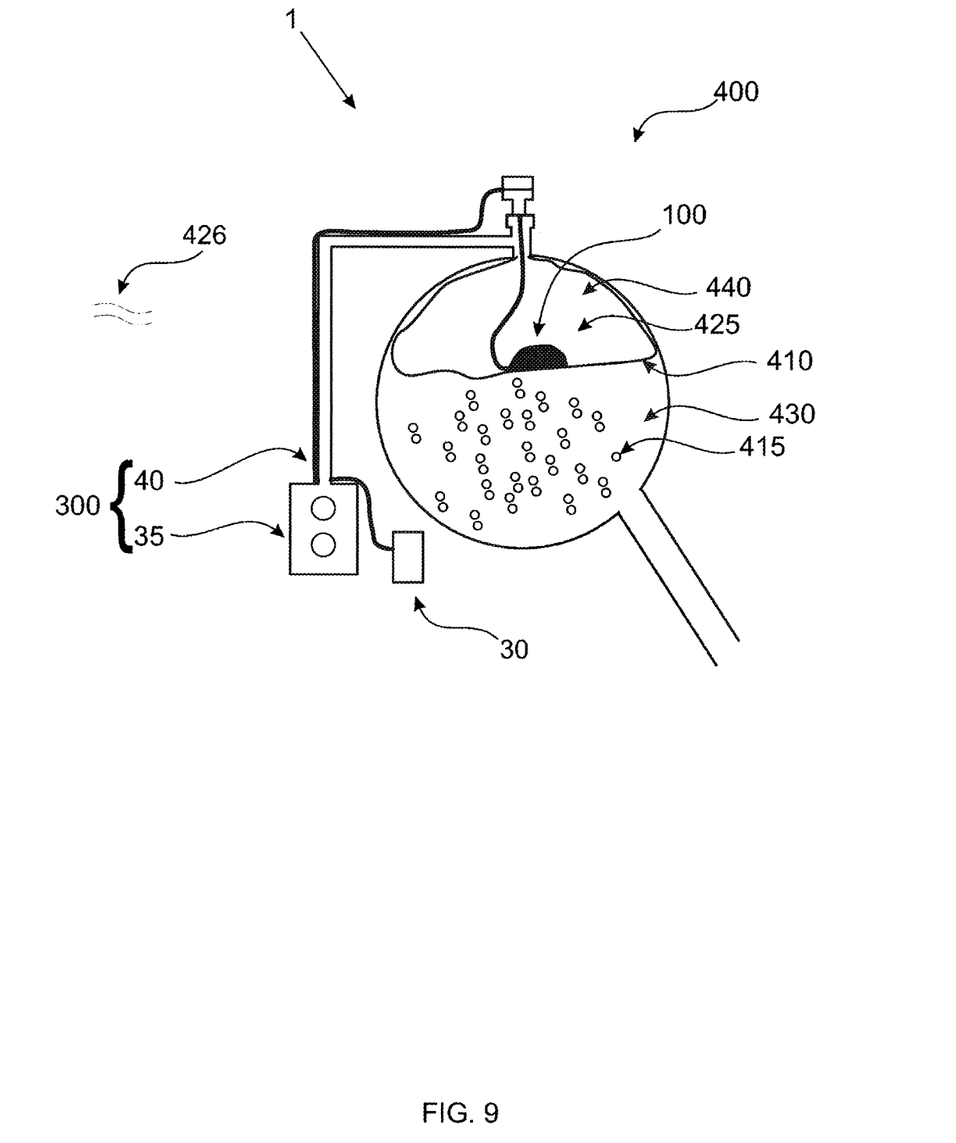
FIG. 9—is a cross-section view of the expansion tank related to the present invention, in which the insulation is complete.

In other words, the sensor set may be understood such as a set of "connected sensors", being preferably installed and positioned on a surface of the bag 410 (sealing) that is not in contact with the liquid in the fluid region 430 of the expansion tank 400, as shown principally in FIG. 9.

In other words, the region of the bag 410 where the sensor set 100 is installed is a surface adjacent to the tension surface of the fluid in the expansion tank 400, whereby the sensor set 100 is arranged in the secondary region 440.

More specifically, the use of a moisture sensor set 20 and a liquid presence sensor set 25 installed as a joint sensor that discloses a variation incompatible with a drying system 35 enhances the safety and security of the facility through predicting and generating alarms, with no need for on-site human assessment, as will be explained in greater detail below. In a preferred embodiment, the moisture sensor 20 is configured to detect and/or measure moisture in a compartment of the electrical equipment within which it is installed.

More specifically, the moisture sensor 20 is configured to detect and/or measure the relative moisture of the compartment (surroundings, region, location) within which it is installed. In this way, the moisture sensor 20 can detect failures in the drying means 300 and/or the sealing system per se.

In other words, the moisture sensor 20 is preferably configured to perform the following actions:

detect moisture in the region where it is installed (fixed), whereby this region is preferably the secondary region 440 of the expansion tank 400, as will be described in greater detail below;

monitor the efficiency of the drying means 300 through an absolute value, trends, standard deviation, and other analytical and/or statistical methods, for example;

detect the occurrence of damage to transformer components that might allow undesired moisture to enter, the components being, for example, the sealing system, the expansion tank 400, among others.

Particularly with regard to the last item mentioned above, the present invention is configured to perform the detection of damage to transformer components that might allow undesired moisture to enter therein, as described, because the mere observation of the drying system 35 (method already used and already known at the state of the art, and widely disseminated in this field) might not indicate the actual damage.

This is because moisture can penetrate into the expansion tank 400 without necessarily passing through the drying system, entering through piping and connections, for example, located after the said drying system 35, for example.

In this context, a possible scenario occurs when moisture is present that did not pass through the drying system 35. This is because, in one embodiment, the drying system 35 is connected to the expansion tank 400 by piping 40, with this piping 40 fitted with sealing along its length.

However, this set of piping 40 and v can present failures that allow the undesired entry of moisture and air from the surrounding environment 426 without necessarily passing through the drying system 300.

It is thus noted that the present invention is configured to solve this problem.

Preferably, the compartment within which the said moisture sensor 20 is installed is the expansion tank 400, which contains, in a preferred embodiment, a region with oil in its interior (fluid region 430) and a region without oil in its interior (secondary region 440). This embodiment is exemplified principally in FIG. 3.

The said moisture sensor 20 is also configured to send a measured moisture value to the centralizing element 30, which is configured to process incoming data, as will be better described below.

The liquid presence sensor 25 is configured to detect the liquid presence in a region within which it is installed. In a preferred embodiment, the liquid presence sensor 25 is installed in the secondary region 440, on a surface of the bag 410 that is not in contact with the liquid in the fluid region 430 of the expansion tank 400, as shown principally in FIG. 3.

Preferably and more specifically, the region of the bag 410 on which the liquid presence sensor 25 is installed is a surface adjacent to the tension surface of the fluid in the expansion tank 400.

However, it must be noted that the said liquid presence sensor 25 will detect the liquid presence only when the said liquid touches (reaches) it physically, whereby the more distant the liquid, the longer the time needed to detect a leak and consequently the larger the volume of fluid leaked from the expansion tank 400.

This is why, in a preferred embodiment, the liquid presence sensor 25 is arranged on a surface adjacent to the tension surface of the fluid in the expansion tank 400.

Furthermore, the liquid presence sensor 25 may be alternatively installed on any surface of the sealing material, such as any surface, adjacent or not, to the tension surface of the fluid in the expansion tank 400 and that is not in contact with the liquid in the fluid region 430 of the said tank 400.

Consequently, the liquid presence sensor 25 is configured to detect the liquid presence in the secondary region 440. Hence, as the liquid presence (fluid) in this region is not desired and results from failures in the sealing system, the liquid presence sensor 25 is configured, to some extent, to detect these failures, which are generally assorted cracks, breaks or failures in the said system that allow the inflow and/or condensation of fluid in regions where this is not desired. In other words, the liquid presence sensor 25 is preferably configured to perform the following actions:

- detect whether there is fluid (oil, water, liquids) in the region where it is installed (preferably in the secondary region 440), whereby it is consequently able to indicate, for example the presence of fluid seeping through a failure in the sealing system, water condensation in the expansion tank 400, among others.

The said liquid presence sensor 25 is also configured to send a liquid detection signal to the centralizing element 30, which is configured to process incoming data, as will be better described below.

Consequently, in general and principally through the installation of the moisture sensor 20 and the liquid presence sensor 25 together, it is noted that the sensor set 100 is configured preferably to perform the following actions:

- detect (distinguish) whether there is the presence of oil or water in the secondary region 440;
- determine the probable failure point through analyzing the log with data obtained through its components;
- indicate the criticality of the failure in question, for example, the risk of water contaminating the oil, using the moisture and liquid presence log as a data source, as will be explained in greater detail below.

Figure 8:
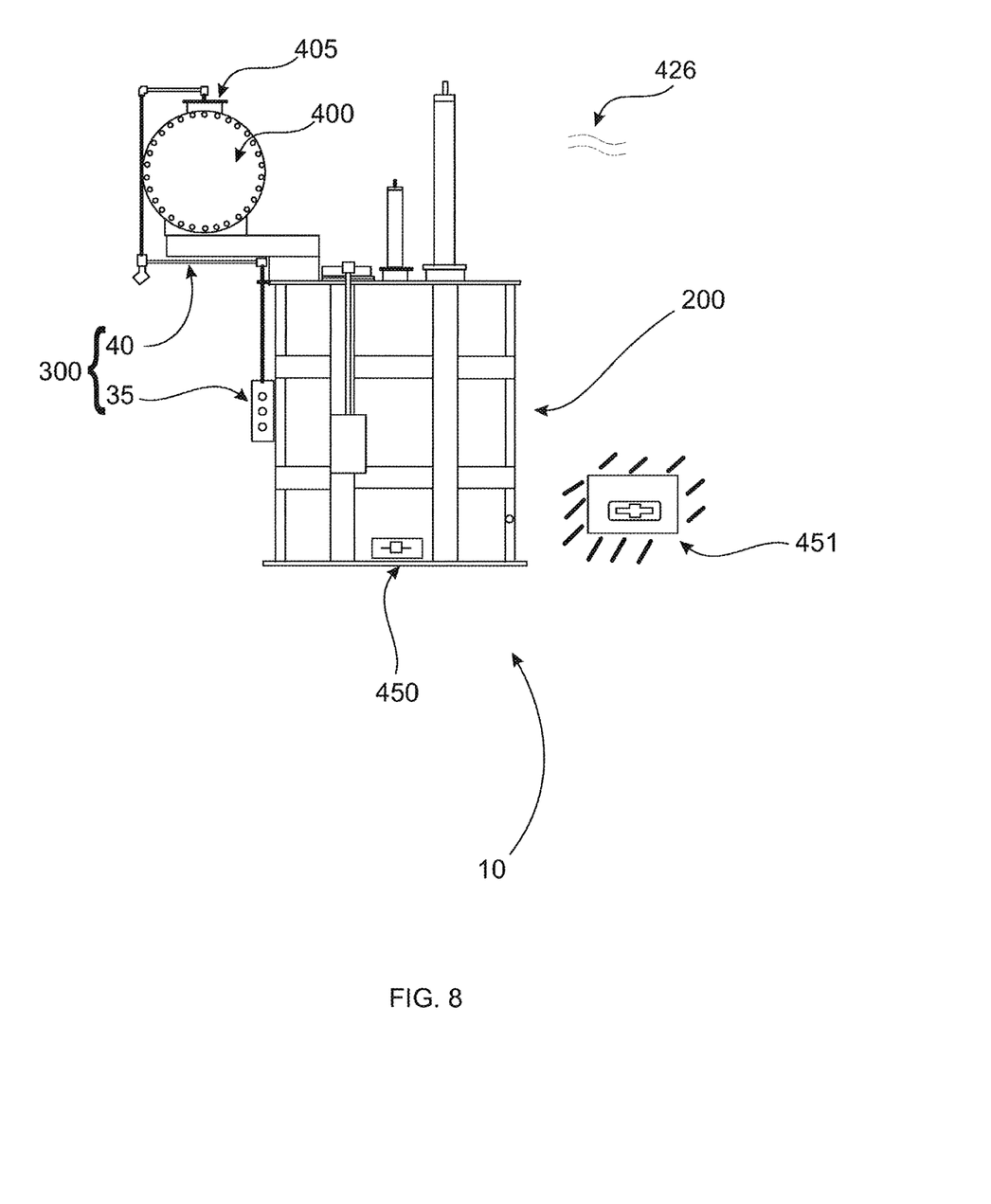
FIG. 8—is an illustration of an embodiment of this invention in a transformer.

In an alternative manner, as shown in FIG. 8, for example, the sensor set 100 may include other sensors, such as a volume (level) sensor, a temperature sensor (thermocouple, thermometer), electrical magnitude meters (multimeters, amperemeters, voltmeters, etc.), an oil moisture sensor de 450, [sic] an external surroundings humidity sensor 451, [sic] among others.

As mentioned, a possible alternative embodiment comprises, for example, the installation of the external surroundings humidity sensor 450, [sic] positioned within shelter, for example, where comparisons are conducted of the moisture in the expansion tank 400 and the ambient humidity, in order to upgrade the system diagnoses.

Another possible embodiment comprises, for example, a transformer oil moisture sensor that can measure moisture within the transformer per se. Consequently, the data acquired by this sensor can be used, for example, to resolve a situation more easily in which the oil (fluid) that leaked through a failure in the sealing system contains moisture and check the origin of this moisture, in other words, if desired, with incomes from air already in the secondary region 440 or whether it was already present in the oil before the detected break.

Nevertheless, it is noted that these are only a few possible embodiments of this invention, which are mentioned here really to exemplify variations and possible embodiments thereof, and must not be understood the characteristics imposing any constraints thereon.

As described above, the sensors are configured to send data and signals to the centralizing element 30. To do so, the sensors comprise a network of interconnected sensors, for example, in a serial network, through which data is sent from each sensor, for example, to the centralizing element 30 through a communications protocol.

Another possible alternative embodiment, which is mentioned only as an example and may not be understood as a characteristic imposing constraints on the present invention, also comprises an ethernet network, which can also include a router or switch (integrated or not with the centralizing element 30) to send information to the centralizing element 30.

Consequently, the centralizing element 30 is configured to receive and process data, transforming it into information on the system. More specifically, the centralizing element 30 is configured to receive at least data from the moisture sensor 30 and the liquid presence sensor 25, whereby the data may be sent through assorted means (wires, cables, wireless, ethernet network, etc.), and the centralizing element 30 may be mounted on the electrical equipment 10 or also at any remote location, provided that the necessary adaptations are undertaken for this purpose (installation of wires, transmission and reception elements, routers, switches, etc.).

The data sent by at least the moisture sensor 20 and the liquid presence sensor 25 are then received by the centralizing element 30, with the centralizing element 30 also configured to define at least one among a determined type of liquids, identifying a probable failure point in the sealing system, and identifying a criticality for the sealing failure.

In other words, the centralizing element 30 must preferably be understood as a computing system (relay), configured to interpret the data sent through the sensor set 100 in such a manner as to determine, for example, a type of fluid in a region, a failure point and its severity, among others.

In other words, in a preferred embodiment, the centralizing element 30 can receive the data from the sensor set 100, interpret them and generate information that is of use to the user in assorted formats such as data for computer networks, relay or analog outputs, LEDs, alarms, among others. This information is, for example, made available to users (on notice boards, displays, remote systems, IHM, etc.), whereby the information provided by the centralizing element 30 includes but is not limited to identifying anomalies, alarms, diagnoses, and tasks to be performed by field work crews, among others.

In an alternative configuration, the centralizing element 30 may also receive data from other system components and process them, detecting and identifying different parameters according to the system configuration, in addition to activating functions, such as alarms and other pertinent systems, as well as communicating with other devices, such as computer networks, for example. More specifically, the centralizing element 30 is configured to group together at least the data from the moisture sensor 20 and the liquid presence sensor 25 and build up a historical dataset.

The said historical dataset must be preferably understood as a set of data acquired by the sensors on earlier occasions. In other words, the historical dataset is a database comprised of at least one among measured moisture values, liquid detection signs, data on the type of liquid, failure points and failure criticalities previously detected and assessed by the monitoring system 1 sensors.

However, this information (data) may not be understood the characteristics imposing constraints on this invention, whereby other information may also and alternatively comprise the historical dataset, such as, for example, dates and times on which a specific occurrence was detected by a sensor, electrical magnitudes in general, among others.

It is noted that each sensor may independently request communication with the centralizing element 30, reporting its measurements, or being "questioned" (queried) automatically by the centralizing element.

With this, in a preferred embodiment, the centralizing element 30 is configured to define at least one among a determined type of liquids, identifying a probable failure point in the sealing system, and identifying a sealing failure criticality, based on at least one among the data from the moisture sensor 20, the liquid presence sensor 25, and the historical dataset.

In other words, the centralizing element 30 also considers the data comprising the historical dataset when in operation.

As a (non-limiting) example, it is noted that the centralizing element 30 takes data from the historical dataset into consideration in order to indicate a probable failure point in the sealing more effectively.

Nevertheless, the data received by the centralizing element 30 result in the generation of an output signal. For example, the output signal can consist of data supplied by the centralizing element 30 through the signaling means 15, which comprises, for example, at least one among an onscreen display, a notice board, remote systems, messages on mobile devices, alarms, visual signaling device, audio signaling device, or computer systems, SCADA, among others, whereby this characteristic may not be taken as constituting a constraint on the present invention.

Figure 3:
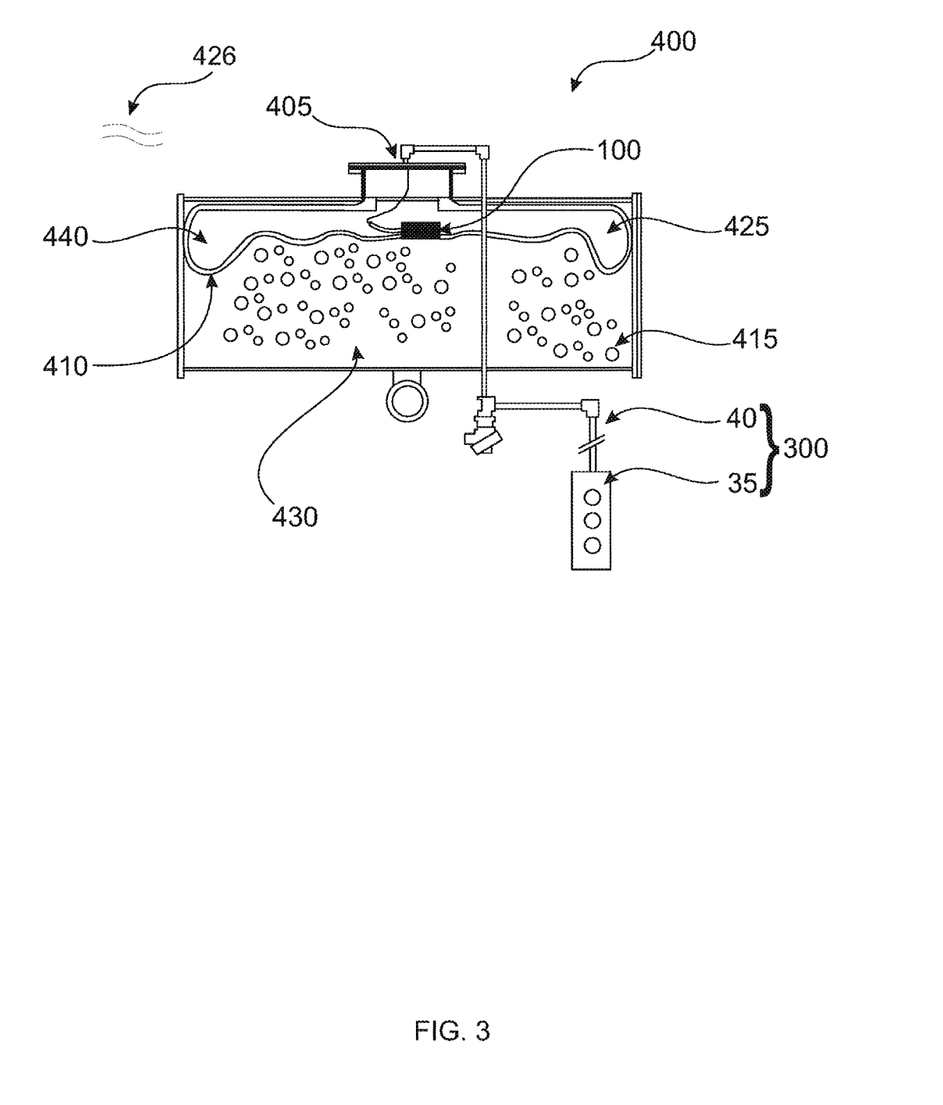
FIG. 3—is an illustration of a cross-section view of an expansion tank fitted with the system and method addressed by this invention, with a sealing system, and complete insulation.

Regarding the sealing as described, it is noted that this is performed by the sealing system, wherein the sealing system is comprised of at least one between a bag 410 and a drying means 35, as illustrated principally in FIG. 3.

With regard to the bag 410, this is preferably made from rubber and arranged in a manner whereby the expansion tank 400 is divided into the fluid region 430 and the secondary region 440, as already described above.

In alternative embodiments, the bag 410 may be made, for example, from polymer or composite materials, or other materials.

With regard to the drying means 35, one preferred embodiment has this component, which is comprised of at least silica. More specifically, silica that comprises the drying means 35 is silica gel, whereby the drying means 35 is configured to dehumidify a mass of air that accesses the expansion tank 400.

However, in an alternative configuration, the drying means 35 may be configured as a Peltier dehumidifier, for example.

The drying means 35 can also have an inspection means, configured to allow inspections of the drying means 35. In a preferred embodiment, the inspection means comprises an opening (window) which allows visual inspections of the silica status. However, other alternative inspection solutions may be implemented, such as assorted meters able to detect the silica parameters and display them to a user.

The present invention also encompasses a sealing monitoring method for electrical equipment 10, wherein the electrical equipment is preferably but not exclusively electrical transformers, as mentioned above, which have at least one expansion tank 400, at least one main tank 200, the main tank 200 configured to receive windings in its interior, with the windings being immersed in a liquid.

The proposed method is configured to comprise preferably the steps described below.

One step of the proposed method comprises the measurement of the moisture in a compartment of the electrical equipment, preferably performed by a moisture sensor 20 with the characteristics described above.

One step of the proposed method comprises the detection of the liquid presence in a region within which a said liquid presence sensor 25 is arranged, wherein the said region is preferably, as already mentioned, one surface of the sealing that is not in contact with the liquid in the fluid region 430 of the expansion tank 400, as shown principally in FIG. 3.

The step described above is performed by a liquid presence sensor 25, wherein the said sensor is configured with the characteristics described above.

One step of the proposed method comprises sending at least one between a measured moisture value and a liquid detection signal to the centralizing element 30.

One step of the proposed method comprises grouping at least the measured moisture value and the liquid detection signal into a historical dataset. However, should other data be measured and/or acquired, they may also comprise the historical dataset, as already mentioned.

One step of the proposed method comprises comparing at least the measured moisture value with at least one moisture reference value.

In a preferred embodiment of the proposed method, it is noted that the steps of grouping a measured moisture value and a liquid detection signal in a historical dataset, and comparing the measured moisture value with at least one moisture reference value are performed by a centralizing element 30, configured according to the characteristics described previously for this component.

More specifically, the centralizing element 30 of this method is configured to receive at least data from the moisture sensor 20 and the liquid presence sensor 25.

Furthermore, as already described, the centralizing element 30 is also configured to define at least one among a determined type of liquids, identifying a probable failure point and identifying a failure criticality, for which it preferably uses at least one from among the data from the moisture sensor 20, the liquid presence sensor 25, and the historical dataset to do so.

Moreover, the proposed method also comprises an additional step of generating an output signal after the step of comparing the measured moisture value with at least one moisture reference value.

In a preferred embodiment, the output signal is emitted through the signaling means 15, which comprises, for example, at least one among an onscreen display, a notice board, remote systems, messages on mobile devices, alarms, visual signaling device, audio signaling device, among others, whereby this characteristic may not be taken as constituting a constraint on the present invention.

More specifically, the additional step of generating the output signal is performed for at least one between when the measured moisture value is greater than the moisture reference value or when a liquid presence is detected in the region where the said liquid presence sensor 25 is arranged.

In general, the proposed sealing monitoring method for electrical equipment comprises elements that also comprise the monitoring system for sealing electrical equipment proposed hearing, with the characteristics and components of the embodiments described for the present invention being complementary.

The present invention also refers to a sealing monitoring device for electrical equipment (preferably transformers such as, for example, those already described), comprising at least one sensor set 100, at least one signaling means 15 and at least one drying means 35, configured in accordance with the characteristics described above.

In order to better exemplify the possible embodiments of this invention, Example 1 is described below, wherein the sensor set 100 is configured for determining the type of liquid (when present), the probable failure point, and the failure criticality, in accordance with a sequence of events represented in this example by a state machine.

Example 1

The system, method, and sealing monitoring device for electrical equipment are configured in a manner whereby a state machine similar is to that exemplified in FIG. 7.

More specifically, in this case, the sensor states indicated, implemented in the following manner:

"([state of liquid presence sensor]; [state of moisture sensor])$^{[reset]}$"

Where the terms in hard brackets have the following meanings:
- [liquid presence sensor state]: Condition of the liquid presence sensor, which can assume the "+" or "0" values to indicate respectively the presence or not of liquid on the sensor. E.g.: (+; [?]) or (0; [?]).
- [moisture sensor state]: Condition of the moisture sensor, which can assume the "0" value when there is little moisture with insignificant variations; the "+" value when there is moisture or significant moisture variations; or "++" when the relative moisture is sufficient to saturate the sensor. E.g.: ([?]; 0), ([?]; +) or ([?]; ++).
- ([?]; [?])$^{[reset]}$: When the "*" marker indicates the deviation that occurs when the user orders a reset, while the sensors are in the condition shown in brackets.

Moreover, each state per se is represented in the following manner:
(Presence of liquid or not, and identification of the liquid; Possible failure; Severity)

Consequently, in this Example 1, it is noted that when the condition of the sensors is altered, there will be a state transition corresponding to the path indicated by the named arrow. Should there be no transition arrow named in accordance with a specific alteration in the sensors, this means that the system state is not altered.

In this context, it is noted that the state machine in the Example is good for indicating the most probable condition of the sealing system, but it is not the only possible embodiment of the machine.

As an example, it is noted that an initial state comprises:
(Dry, Whole, Safe)

From then on, the sensor set can detect a series of conditions and characteristics that lead to a state transition.

Starting out from this state, it is noted that, if the ([0, +]) condition is detected, in other words, there is no liquid, but there is moisture, the attained state (next state) will be, for example:
(Dry; Possible failure in the drying system; Severity: low)

Also starting out at the initial state, it is noted that, if the ([+, ++]) condition is detected, in other words, there is liquid and there is a relatively high moisture content, the state attained (next state) will be, for example:
(Probable presence of water; Possible failure in the sealing; Severity: medium)

Still starting out at the initial state, it is noted that, if the ([+, +]) condition is detected, in other words, there is liquid and there is a relatively low moisture content, the state attained (next state) will be, for example:
(Probable presence of oil; Possible failure in the membrane; Severity: medium)

Following this same logic, by means of this invention it is possible to detect a plurality of different scenarios, considering principally detections by the sensor set 100, with states corresponding to each detection and as from each state, performing a transition to a next state under specific conditions.

Furthermore, as may be noted principally in Example 1 above, the present invention is configured to allow the detection for each state of a possible criticality (severity) of a failure (if it occurs) and also the type of liquids in the secondary region 440, such as oil or water, for example.

However, a state machine is not necessarily the only way of reading the blog and the combination of sensor measurements in order to indicate the operating condition of the sealing system; however, this proposal described principally in Example 1 clearly illustrates the concept, and is also a functional implementation, using a parameter evolution matrix with pertinent analyses at each node, as well as considering the past records of the sensor measurements, either directly or treated through stochastic methods, and in light of failure progression charts.

It is stressed that there are other possible analysis embodiments, without extending beyond the scope of this Application, such as adding states or defining numerical relevance levels to each datum reported through the specific sensor.

Finally, the present invention also comprises electrical equipment 10 with monitored sealing, comprising at least one expansion tank 400, at least one main tank 200, the main tank 200 being configured to receive windings in its interior, the windings being immersed in a fluid.

In a preferred embodiment, the electrical equipment 10 is insulated with oil and fitted with at least one expansion tank 400, such as an electrical transformer of any type described previously, but may alternatively be reactors, for example.

The electrical equipment 10 with monitored sealing has a sealing system comprised of at least one between the bag 410 and a drying means 35, the sealing system being configured to comprise at least one tank for the electrical equipment 10 that is divided into a fluid region 430, configured to receive the fluid into its interior, and a secondary region 440.

The secondary region 440 is configured to remain fluid-free in the absence of at least one failure in the sealing system and receive fluid into its interior, because of at least one failure in the sealing system.

With regard to the sealing system, in a preferred embodiment, this is monitored by at least one sensor set 100, wherein the sensor set 100 comprises at least one moisture sensor 20, at least one liquid presence sensor 25 and at least one centralizing element 30, in accordance with the characteristics already mentioned and described previously, with regard to the proposed system, method, and device.

In this way, and considering the characteristics described above, the present invention proposes a monitoring sealing system, method, and device 1 for electrical equipment 10 and electrical equipment 10 with monitored sealing configured with a sensor set 100 that can directly measure the moisture in a tank and analyze its variations through methods, for example stochastic, that disclose a variation incompatible with a drying means, enhancing safety and security of the facility through predicting and generating alarms, with no need for on-site human assessment.

Furthermore, the present invention is configured to advantageously determine which fluid is being detected by the sensor, such as for example between oil or water, as a function of detecting the liquid (fluid) and moisture measurements log, using, for example, an evolution matrix for the detected parameters.

In this way, the present invention can determine probable failure points in the sealing system, as well as assessing the contamination risk level for the insulating oil, through an analysis of the past records of the progression of the measurements from the sensor set 100, either directly or through treatments using stochastic methods and in light of failure progression charts Moreover, as described, the present invention also advantageously allows sensor integration, such as for example, external, internal moisture sensors, etc., installed for comparing values, enhancing the accuracy of the system, and doing away with the need for possible stochastic calculations in order to determine the loss of efficiency of the drying system, determining whether the moisture measured in the oil was already present in the transformer oil, whether it was introduced through a failure In the expansion tank.

Having described one example of a preferred embodiment, it must be understood that the scope of this invention encompasses other possible variations, being limited only by the content of the Claims appended hereto, with possible equivalents included therein.

The invention claimed is:

1. A sealing monitoring system (1) for electrical equipment (10) comprising at least one sensor set (100), at least one signaling means (15) and at least one drying system (300), the sealing monitoring system (1) for electrical equipment (10) being characterized in that the sensor set (100) comprises at least one moisture sensor (20) and at least one liquid presence sensor (25) connected to at least one centralizing element (30), wherein the moisture sensor (20) is configured to measure moisture in a compartment of the electrical equipment (10) and send a measured moisture value to the centralizing element (30), the liquid presence sensor (25) is configured to detect the liquid presence in a region where the said liquid presence sensor (25) is arranged and send a liquid detection signal to the centralizing element (30), the centralizing element (30) is configured to receive at least data from the moisture sensor (20) and the liquid presence sensor (25), wherein the centralizing element (30) is also configured to define at least one among a determined type of liquids, identifying a probable failure point in the sealing system, and identifying a failure criticality for the sealing, wherein the centralizing element (30) is configured to define at least one among a determined type of liquids, identifying a probable failure point in the sealing system, and identifying a failure criticality for the sealing, based on at least one among the data from the moisture sensor (20), the liquid presence sensor (25) and the historical dataset, wherein the at least one among a liquid type determination, identifying a probable failure point in the sealing system, and identifying a failure criticality for the sealing is performed at least, on the basis of detections by the sensor set (100).

2. The sealing monitoring system (1) for electrical equipment (10) in accordance with claim 1, wherein the centralizing element (30) is configured to group together at least the data from the moisture sensor (20) and the liquid presence sensor (25) and build up a historical dataset, wherein the historical dataset is configured to be related as well to at least the liquid type determination, identification of the probable failure point in the sealing system, and identification of the failure criticality in the sealing.

3. The sealing monitoring system (1) for electrical equipment (10) in accordance with claim 2, wherein the sealing is performed by means of a sealing system, wherein the sealing system is comprised of at least one among the bag (410), a drying means (35) and piping (40) of the drying system (300).

4. The sealing monitoring system (1) for electrical equipment (10) in accordance with claim 3, wherein the electrical equipment (10) consists of transformers, wherein the transformers have at least one expansion tank (400), at least one main tank (200), the main tank (200) the configured to receive windings into its interior, the windings being immersed in a fluid (415).

5. The sealing monitoring system (1) for electrical equipment (10) in accordance with claim 4, wherein the sealing system of the electrical equipment (10) is configured with at least one tank for the electrical equipment (10) that is divided into a fluid region (430) and a secondary region (440), wherein the fluid region (430) is configured to receive the fluid (415) into its interior, wherein the secondary region (440) is configured to remain dry in the absence of at least one failure in the sealing system and receive at least one among fluid or moisture into its interior on the accounts of at least one failure in the sealing system.

6. The sealing monitoring system (1) for electrical equipment (10) in accordance with claim 5, wherein the sensor set (100) is installed and positioned on a surface of the bag (410) that is not in contact with the liquid in the fluid region (430) of the expansion tank (400).

7. The sealing monitoring system (1) for electrical equipment (10) in accordance with claim 6, wherein the sensor set (100) is installed and positioned on the bag (410) in the secondary region (440).

8. A sealing monitoring method for electrical equipment (10), the electrical equipment (10) comprising at least one sensor set (100), at least one signaling means (15) and at least one drying system (300), the sealing monitoring method for electrical equipment (10) being characterized in that the monitored sealing is comprised of a sealing system, wherein the sealing system is comprised of at least one among the bag (410), a drying means (35) and piping (40) of the drying system (300), the sealing monitoring method for electrical equipment (10) comprising at least the steps of:
measuring the moisture in a compartment of the electrical equipment (10);
detecting the liquid presence in a region where the said liquid presence sensor (25) is arranged;
sending at least one between a measured moisture value and a liquid detection signal to the centralizing element (30);
grouping at least the measured moisture value and the liquid detection signal into a historical dataset;
comparing at least the measured moisture value with at least one moisture reference value;
performing at least one among a liquid type determination, identification of a probable failure point, and identification of a failure criticality.

9. The sealing monitoring method for electrical equipment (10) in accordance with claim 8, further comprising an additional step of generating an output signal.

10. The sealing monitoring method for electrical equipment (10) in accordance with claim 9, wherein the additional step of generating the output signal is performed on at least one of: (i) when the measured moisture value is greater than the moisture reference value; and (ii) when the liquid presence is detected in the region where the said liquid presence sensor (25) is arranged, and wherein values may also be taken into consideration, related to a variation in the measured moisture value.

11. The sealing monitoring method for electrical equipment (10) in accordance with claim 10, wherein the step of measuring the moisture in a compartment of the electrical equipment (10) is performed by a moisture sensor (20).

12. The sealing monitoring method for electrical equipment (10) in accordance with claim 11, wherein the step of detecting the liquid presence in a region where the said liquid presence sensor (25) is arranged is performed by a liquid presence sensor (25).

13. The sealing monitoring method for electrical equipment (10) in accordance with claim 12, wherein the steps of grouping the measured moisture value and a liquid detection signal in a historical dataset, and comparing the measured moisture value with at least one moisture reference value are performed by a centralizing element (30).

14. The sealing monitoring method for electrical equipment (10) in accordance with claim 13, wherein the centralizing element (30) is configured to receive at least data from the moisture sensor (20) and the liquid presence sensor (25), wherein the centralizing element (30) is also configured to define at least one among a determined type of liquids, identification of a probable failure point, and identification of a failure criticality.

15. The sealing monitoring method for electrical equipment (10) in accordance with claim 14, wherein the centralizing element (30) is configured to define at least one among a determined type of liquids, identification of a probable failure point, and identification of a failure criticality, based on at least one among the data from the moisture sensor (20), the liquid presence sensor (25) and the historical dataset.

16. The sealing monitoring method for electrical equipment (10) in accordance with claim 15, wherein the electrical equipment (10) consists of transformers, wherein the transformers have at least one expansion tank (400), at least one main tank (200), the main tank (200) the configured to receive windings in its interior, the windings being immersed in a fluid (415).

17. The sealing monitoring method for electrical equipment (10) in accordance with claim 16, wherein the sealing system of the monitored electrical equipment (10) is configured with at least one tank for the electrical equipment (10) that is divided into a fluid region (430) and a secondary region (440),
wherein the fluid region (430) is configured to receive the fluid (415) into its interior,
wherein the secondary region (440) is configured to remain dry in the absence of at least one failure in the sealing system and receive fluid into its interior, because of at least one failure in the sealing system.

18. The sealing monitoring method for electrical equipment (10) in accordance with claim 17, wherein the sensor set (100) is installed and positioned on a surface of the bag (410) that is not in contact with the liquid in the fluid region (430) of the expansion tank (400).

19. The sealing monitoring method for electrical equipment (10) in accordance with claim 18, wherein the sensor set (100) is installed and positioned on the bag (410) in the secondary region (440).

20. The sealing monitoring method for electrical equipment (10) in accordance with claim 19, wherein the liquid presence sensor (25) is configured to detect the presence of at least one between water and oil.

21. The sealing monitoring method for electrical equipment (10) in accordance with claim 20, wherein at least one among a liquid type determination, identifying a probable failure point in the sealing system, and identifying a failure criticality in the sealing is performed at least on the basis of detections by the sensor set (100).

22. A sealing monitoring device for electrical equipment (10) comprising at least one sensor set (100), at least one signaling means (15) and at least one drying system (300), the sealing monitoring device for electrical equipment (10) being characterized in that the sensor set (100) comprises at least one moisture sensor (20) and at least one liquid presence sensor (25) connected to at least one centralizing element (30),
the moisture sensor (20) is configured to measure moisture in a compartment of the electrical equipment (10) and send a measured moisture value to the centralizing element (30), wherein
the liquid presence sensor (25) is configured to detect the presence of at least one between water and oil in a region where the said liquid presence sensor (25) is arranged and send a liquid detection signal to the centralizing element (30),
wherein the centralizing element (30) is configured to receive at least data from the moisture sensor (20) and the liquid presence sensor (25), grouping the data from the moisture sensor (20) and the liquid presence sensor (25) and build up a historical dataset and perform at least one among a liquid type determination, identifying a probable failure point in the sealing system, and identifying a failure criticality in the sealing, based on the data received at least based on detections by the sensor set (100),
the sealing being undertaken through a sealing system, wherein the sealing system is comprised of at least one among the bag (410) and the drying system (300) comprised of at least one drying means (35) and piping (40), wherein the sealing system of the electrical equipment (10) is configured with at least one tank for the electrical equipment (10) that is divided into a fluid region (430) and a secondary region (440), wherein the fluid region (430) is configured to receive the fluid into its interior, wherein the secondary region (440) is configured to remain fluid-free in the absence of at least one failure in the sealing system and receive fluid into its interior, because of at least one failure in the sealing system, wherein the sensor set (100) is installed and positioned on the secondary region (440), on a surface of the bag (410) that is not in contact with the liquid in the fluid region (430) of the expansion tank (400), wherein the at least one among determining the type of liquid, identifying a probable failure point in the sealing system, and identifying a failure criticality in the sealing is performed at least based on detections by the sensor set (100).

23. The sealing monitoring device for electrical equipment (10) in accordance with claim 22, wherein the sensor set (100) is installed and positioned on the bag (410) in the secondary region (440).

24. The sealing monitoring device for electrical equipment (10) in accordance with claim 23, wherein the liquid presence sensor (25) is configured to detect the presence of at least one between water and oil in the region where it is installed.

25. Electrical equipment (10) with monitored sealing comprising at least one expansion tank (400), at least one main tank (200), the main tank (200) the configured to receive windings in its interior, the windings being immersed in a fluid (415), the electrical equipment (10) being characterized in that it has the sealing system comprised of at least one among the bag (410) and a drying system (300), the sealing system being configured to comprise at least one electrical equipment (10) tank that is divided into a fluid region (430) and a secondary region (440), wherein the fluid region (430) is configured to receive the fluid (415) into its interior, wherein the secondary region (440) is configured to remain fluid-free in the absence of at least one failure in the sealing system and receive fluid into its interior, because of at least one failure in the sealing system, wherein the sealing system is monitored by at least one sensor set (100), wherein the sensor set comprises at least one moisture sensor (20) and at least one liquid presence sensor (25) connected to at least one centralizing element (30), wherein the centralizing element (30) is configured to define at least one among a determined type of liquids, identifying a probable failure point in the sealing system, and identifying a failure criticality in the sealing, based on at least one among the data from the moisture sensor (20), the liquid presence sensor (25) and the historical dataset.

26. The electrical equipment (10) with monitored sealing in accordance with claim 25, wherein the moisture sensor (20) is configured to measure moisture in a compartment of the electrical equipment (10) and send a measured moisture value to the centralizing element (30), the liquid presence sensor (25) is configured to detect the liquid presence in a region where the said liquid presence sensor (25) is arranged and send a liquid detection signal to the centralizing element (30), the centralizing element (30) is configured to receive at least data from the moisture sensor (20) and the liquid presence sensor (25), wherein the centralizing element (30) is also configured to define at least one among a determined type of liquids, identifying a probable failure point in the sealing system, and identifying a failure criticality in the sealing.

27. The electrical equipment (10) with monitored sealing in accordance with claim 26, wherein the centralizing element (30) is configured to group together at least the data from the moisture sensor (20) and the liquid presence sensor (25) and build up a historical dataset.

28. The electrical equipment (10) with monitored sealing in accordance with claim 27, wherein the drying system (300) is comprised of at least one drying means (35) and piping (40).

29. The electrical equipment (10) with monitored sealing in accordance with claim 28, wherein the drying system (300) is configured to be inspected through an inspection means.

30. The electrical equipment (10) with monitored sealing in accordance with claim 29, wherein it is configured as an electrical transformer.

31. The electrical equipment (10) with monitored sealing in accordance with claim 30, wherein the sensor set (100) is installed and positioned on a surface of the bag (410) that is not in contact with the liquid in the fluid region (430) of the expansion tank (400).

32. The electrical equipment (10) with monitored sealing in accordance with claim 31, wherein the sensor set (100) is installed and positioned on the bag (410) in the secondary region (440).

33. The electrical equipment (10) with monitored sealing in accordance with claim 32, wherein the liquid presence sensor (25) is configured to detect the presence of at least one between water and oil.

34. The electrical equipment (10) with monitored sealing in accordance with claim 33, wherein at least one among a liquid type determination, identification of a probable failure point in the sealing system, and identification of a failure criticality in the sealing is performed at least on the basis on detections by the sensor set (100).

* * * * *